United States Patent
Kuo et al.

(10) Patent No.: US 11,837,500 B2
(45) Date of Patent: Dec. 5, 2023

(54) SELECTIVE DEPOSITION OF METAL BARRIER IN DAMASCENE PROCESSES AND THE STRUCTURES FORMED THEREOF

(71) Applicant: Taiwan Semiconductor Manufacturing Co., Ltd., Hsinchu (TW)

(72) Inventors: Chia-Pang Kuo, Taoyuan (TW); Ya-Lien Lee, Baoshan Township (TW); Chieh-Yi Shen, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/809,919

(22) Filed: Jun. 30, 2022

(65) Prior Publication Data
US 2022/0328347 A1 Oct. 13, 2022

Related U.S. Application Data

(62) Division of application No. 16/213,622, filed on Dec. 7, 2018, now Pat. No. 11,398,406.
(Continued)

(51) Int. Cl.
*H01L 21/768* (2006.01)
*H01L 23/522* (2006.01)
*H01L 23/532* (2006.01)

(52) U.S. Cl.
CPC .... *H01L 21/76844* (2013.01); *H01L 21/7681* (2013.01); *H01L 21/76879* (2013.01); *H01L 23/5226* (2013.01); *H01L 23/53238* (2013.01)

(58) Field of Classification Search
CPC .......... H01L 21/76844; H01L 21/7681; H01L 21/76879; H01L 23/5226; H01L 23/53238
(Continued)

(56) References Cited

U.S. PATENT DOCUMENTS

| 6,541,374 B1 | 4/2003 | de Felipe et al. |
| 6,852,635 B2 | 2/2005 | Satta et al. |

(Continued)

FOREIGN PATENT DOCUMENTS

| JP | 2003243498 A | 8/2003 |
| JP | 2008078647 A | 4/2008 |

(Continued)

OTHER PUBLICATIONS

Moon et al., "Effects of NH3 Plasma Pre-Treatment of Ta Substrate on Atomic Layer Deposition of Cu Thin Film," Journal of Nanoscience and Nanotechnology, vol. 12, No. 4, 2012, pp. 3661-3664.
(Continued)

*Primary Examiner* — Lex H Malsawma
*Assistant Examiner* — Eric W Jones
(74) *Attorney, Agent, or Firm* — Slater Matsil, LLP

(57) ABSTRACT

A method of forming an integrated circuit structure includes forming an etch stop layer over a conductive feature, forming a dielectric layer over the etch stop layer, forming an opening in the dielectric layer to reveal the etch stop layer, and etching the etch stop layer through the opening using an etchant comprising an inhibitor. An inhibitor film comprising the inhibitor is formed on the conductive feature. The method further includes depositing a conductive barrier layer extending into the opening, performing a treatment to remove the inhibitor film after the conductive barrier layer is deposited, and depositing a conductive material to fill a remaining portion of the opening.

20 Claims, 16 Drawing Sheets

Related U.S. Application Data

(60) Provisional application No. 62/738,414, filed on Sep. 28, 2018.

(58) Field of Classification Search
USPC .......................................................... 257/751
See application file for complete search history.

(56) References Cited

U.S. PATENT DOCUMENTS

| | | | |
|---|---|---|---|
| 7,968,506 | B2 | 6/2011 | Chou et al. |
| 8,247,321 | B2 | 8/2012 | Matsumoto et al. |
| 9,543,234 | B2 | 1/2017 | JangJian et al. |
| 2002/0081837 | A1* | 6/2002 | Hong ............... H01L 21/76877 257/E21.585 |
| 2003/0111735 | A1* | 6/2003 | Lee ................. H01L 21/76868 257/E21.585 |
| 2004/0171256 | A1 | 9/2004 | Oladeji et al. |
| 2005/0153544 | A1* | 7/2005 | Suh ................. H01L 21/76844 438/643 |
| 2005/0200026 | A1 | 9/2005 | Liaw |
| 2006/0019414 | A1 | 1/2006 | Wang et al. |
| 2006/0102988 | A1 | 5/2006 | Tolchinsky et al. |
| 2008/0132057 | A1 | 6/2008 | Feustel et al. |
| 2010/0081277 | A1 | 4/2010 | Schaller et al. |
| 2010/0178768 | A1 | 7/2010 | Li |
| 2010/0320604 | A1 | 12/2010 | Isobayashi |
| 2011/0244680 | A1 | 10/2011 | Tohnoe et al. |
| 2013/0323930 | A1 | 12/2013 | Chattopadhyay et al. |
| 2017/0092580 | A1 | 3/2017 | Huang et al. |

FOREIGN PATENT DOCUMENTS

| | | |
|---|---|---|
| JP | 2009206472 A | 9/2009 |
| KR | 20030027817 A | 4/2003 |
| KR | 20130007387 A | 1/2013 |

OTHER PUBLICATIONS

Volpi et al., "XPS studies of the ALD-growth of TaN diffusion barriers: Impact of the dielectric surface chemistry on the growth mechanism," Microelectronic Engineering, vol. 85, No. 10, Oct. 2008, pp. 2068-2070.

* cited by examiner

SELECTIVE DEPOSITION OF METAL BARRIER IN DAMASCENE PROCESSES AND THE STRUCTURES FORMED THEREOF

PRIORITY CLAIM AND CROSS-REFERENCE

This application is a divisional of U.S. patent application Ser. No. 16/213,622, entitled "Selective Deposition of Metal Barrier in Damascene Processes," filed Dec. 7, 2018, which claims the benefit of the U.S. Provisional Application No. 62/738,414, entitled "Selective Deposition of Metal Barrier in Damascene Processes," filed Sep. 28, 2018, which applications are hereby incorporated herein by reference.

BACKGROUND

Integrated circuits include interconnect structures, which comprise metal lines and vias to serve as three-dimensional wiring structures. The function of the interconnect structures is to properly connect densely packed devices together.

Metal lines and vias are formed in the interconnect structure. Metal lines and vias are typically formed by damascene processes, in which trenches and via openings are formed in dielectric layers. A barrier layer is then deposited, followed by the filling of the trenches and via openings with copper. After a Chemical Mechanical Polish (CMP) process, the top surfaces of the metal lines are leveled, leaving metal lines and vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
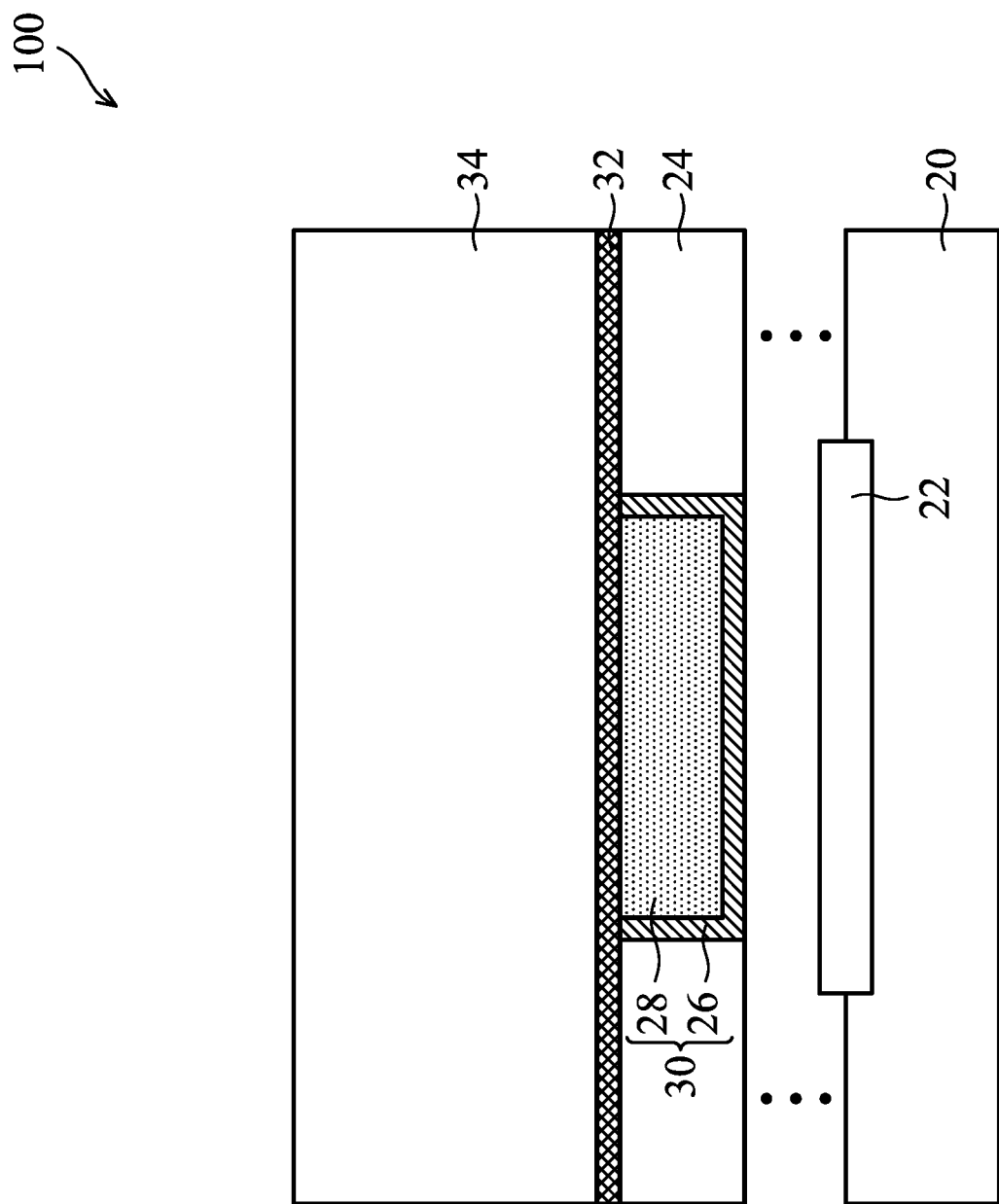
FIGS. 1 through 9 illustrate the cross-sectional views of intermediate stages in the formation of a metal line and a via in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of selectively forming a conductive barrier layer for a conductive feature is provided in accordance with various embodiments. The intermediate stages in the formation of the conductive feature are illustrated in accordance with some embodiments. Some variations of some embodiments are discussed. Throughout the various views and illustrative embodiments, like reference numbers are used to designate like elements. In accordance with some embodiments of the present disclosure, the formation of the conductive feature includes selectively forming a conductive barrier layer in an opening, filling a metallic material, and performing a planarization. The selective formation of the conductive barrier layer is achieved through forming an inhibitor film on an underlying metal feature, depositing the conductive barrier layer, with a delayed growth achieved on the inhibitor film, so that the conductive barrier layer is selectively grown on the sidewalls of the via opening, with very little (if any) conductive barrier layer being formed on the inhibitor film. After the conductive barrier layer is formed, a treatment is performed to remove the inhibitor film. The remaining opening is then filled with a metallic material such as copper.

Figure 18:
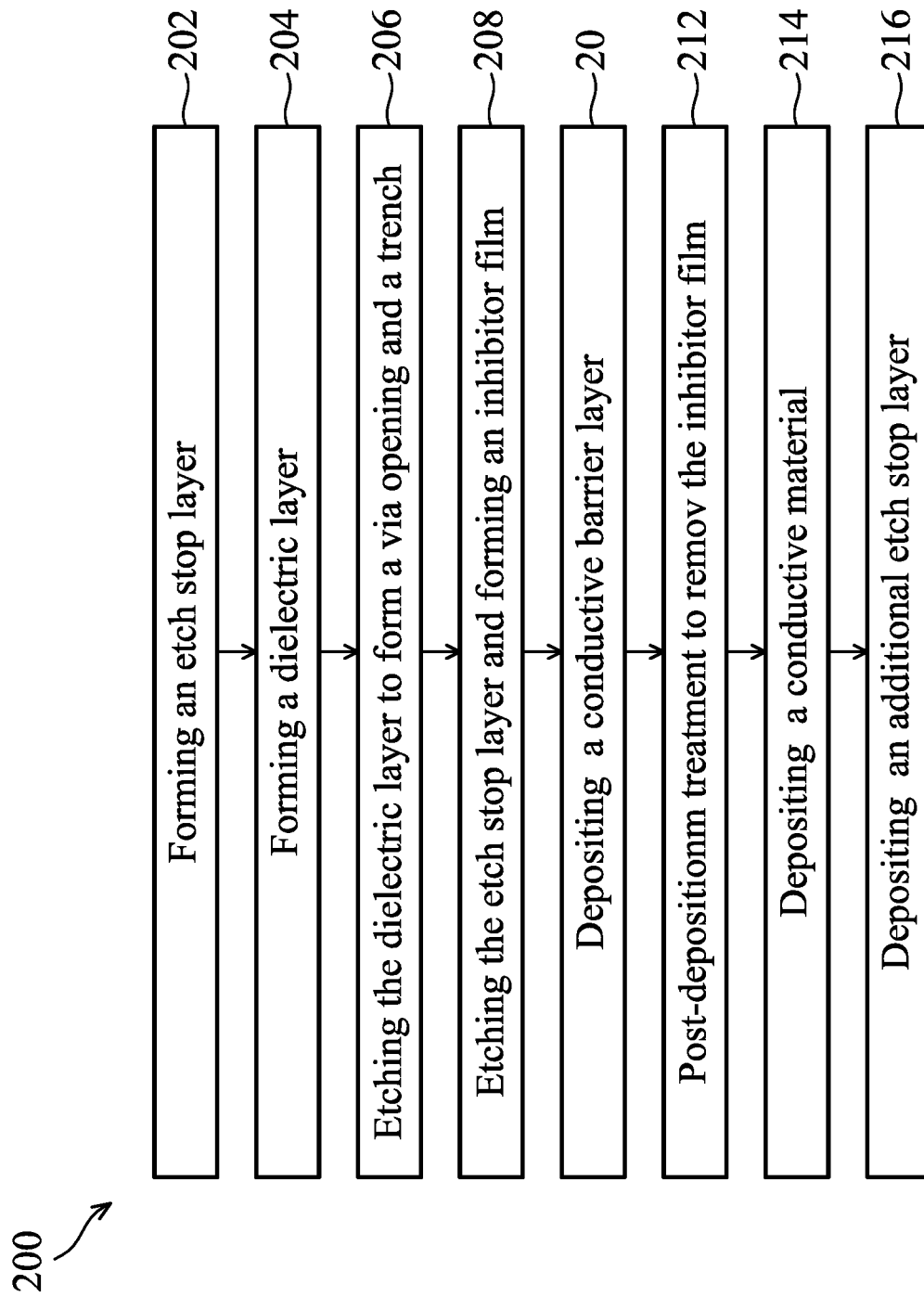
FIG. 18 illustrates a process flow for forming a metal line and a via in accordance with some embodiments.

FIGS. 1 through 9 illustrate the cross-sectional views of intermediate stages in the formation of a via in accordance with some embodiments of the present disclosure. The corresponding processes are also reflected schematically in the process flow 200 as shown in FIG. 18.

FIG. 1 illustrates a cross-sectional view of package component 100. In accordance with some embodiments of the present disclosure, package component 100 is a device wafer (such as a logic device wafer) including active devices such as transistors and/or diodes, and possibly passive devices such as capacitors, inductors, resistors, or the like. In accordance with alternative embodiments of the present disclosure, package component 100 is an interposer wafer, which may or may not include active devices and/or passive devices. In accordance with yet alternative embodiments of the present disclosure, package component 100 is a package substrate strip, which may include package substrates with cores therein or core-less package substrates. In subsequent discussion, a device wafer is used as an example of the package component 100. The teaching of the present disclosure may also be applied to interposer wafers, package substrates, packages, etc.

In accordance with some embodiments of the present disclosure, package component 100 includes semiconductor substrate 20 and the features formed at a top surface of semiconductor substrate 20. Semiconductor substrate 20 may comprise crystalline silicon, crystalline germanium, silicon germanium, a III-V compound semiconductor such as GaAsP, AlInAs, AlGaAs, GaInAs, GaInP, GaInAsP, or the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be formed to extend into semiconductor substrate 20, wherein the through-vias are used to electrically inter-couple the features on opposite sides of package component 100.

In accordance with some embodiments of the present disclosure, package component 100 is used to form a device die. In these embodiments, integrated circuit devices 22 are formed on the top surface of semiconductor substrate 20 The examples of integrated circuit devices 22 include Complementary Metal-Oxide Semiconductor (CMOS) transistors, resistors, capacitors, diodes, or the like. The details of integrated circuit devices 22 are not illustrated herein. In accordance with alternative embodiments, package component 100 is used for forming interposers. In accordance with these embodiments, substrate 20 may also be a dielectric substrate.

Further illustrated in FIG. 1 is dielectric layer 24. Dielectric layer 24 may be an Inter-Layer Dielectric (ILD) or an Inter-Metal Dielectric (IMD). In accordance with some embodiments of the present disclosure, Dielectric layer 24 is an ILD, in which contact plugs are formed. The corresponding dielectric layer 24 may be formed of Phospho Silicate Glass (PSG), Boro Silicate Glass (BSG), Boron-Doped Phospho Silicate Glass (BPSG), Fluorine-Doped Silicate Glass (FSG), a silicon oxide layer (formed using Tetra Ethyl Ortho Silicate (TEOS)), or the like. Dielectric layer 24 may be formed using spin-on coating, Atomic Layer deposition (ALD), Flowable Chemical Vapor Deposition (FCVD), Chemical Vapor Deposition (CVD), Plasma-Enhanced Chemical Vapor Deposition (PECVD), Low-Pressure Chemical Vapor Deposition (LPCVD), or the like. In accordance with some embodiments of the present disclosure, Dielectric layer 24 is an IMD, in which metal lines and/or vias are formed. The corresponding dielectric layer 24 may be formed of a carbon-containing low-k dielectric material, Hydrogen SilsesQuioxane (HSQ), MethylSilsesQuioxane (MSQ), or the like. In accordance with some embodiments of the present disclosure, the formation of dielectric layer 24 includes depositing a porogen-containing dielectric material, and then performing a curing process to drive out the porogen, and hence the remaining dielectric layer 24 is porous.

Conductive feature 30 is formed in dielectric layer 24. Conductive feature 30 may be a metal line, a conductive via, a contact plug, or the like. In accordance with some embodiments, conductive feature 30 includes diffusion barrier layer 26 and conductive filling material 28 over diffusion barrier layer 26. Diffusion barrier layer 26 may be formed of a conductive material such as titanium, titanium nitride, tantalum, tantalum nitride, or the like. Conductive region 28 may be formed of copper, a copper alloy, aluminum, or the like. Diffusion barrier layer 26 has the function of preventing the diffusion of the material (such as copper) in conductive region 28 from diffusing into dielectric layer 24. In accordance with some embodiments of the present disclosure, the formation of conductive feature 30 may also adopt the methods as discussed subsequently, so that the bottom portion of diffusion barrier layer is either not formed, or formed as discontinued including isolated islands.

As also shown in FIG. 1, etch stop layer 32 is formed over dielectric layer 24 and conductive feature 30. The respective process is illustrated as process 202 in the process flow shown in FIG. 18. Etch stop layer 32 is formed of a dielectric material, which may include, and is not limited to, aluminum oxide, aluminum nitride, silicon nitride, silicon carbide, silicon oxynitride, silicon carbo-nitride, or the like. Etch stop layer 32 is formed of a material that has a high etching selectivity with relative to the overlying dielectric layer 34, and hence etch stop layer 32 may be used to stop the etching of dielectric layer 34.

Dielectric layer 34 is formed over etch stop layer 32. The respective process is illustrated as process 204 in the process flow shown in FIG. 18. In accordance with some embodiments, dielectric layer 34 is an IMD or an ILD. Dielectric layer 34 may comprise a dielectric material such as an oxide, a nitride, a carbon-containing dielectric material, or the like. For example, dielectric layer 34 may be formed of PSG, BSG, BPSG, FSG, TEOS oxide, HSQ, MSQ, or the like. Dielectric layer 34 may also be a low-k dielectric layer having a low dielectric constant value lower than about 3.5 or lower than about 3.0.

FIGS. 2 through 8 illustrate the process for forming a metal line and a via in accordance with some embodiments. It is appreciated that the examples as shown in FIGS. 2 through 8 recite a dual damascene process. In accordance with alternative embodiments, a single damascene process, in which a metal line, a via, a contact plug, or the like, is formed, which is also contemplated.

Figure 2:
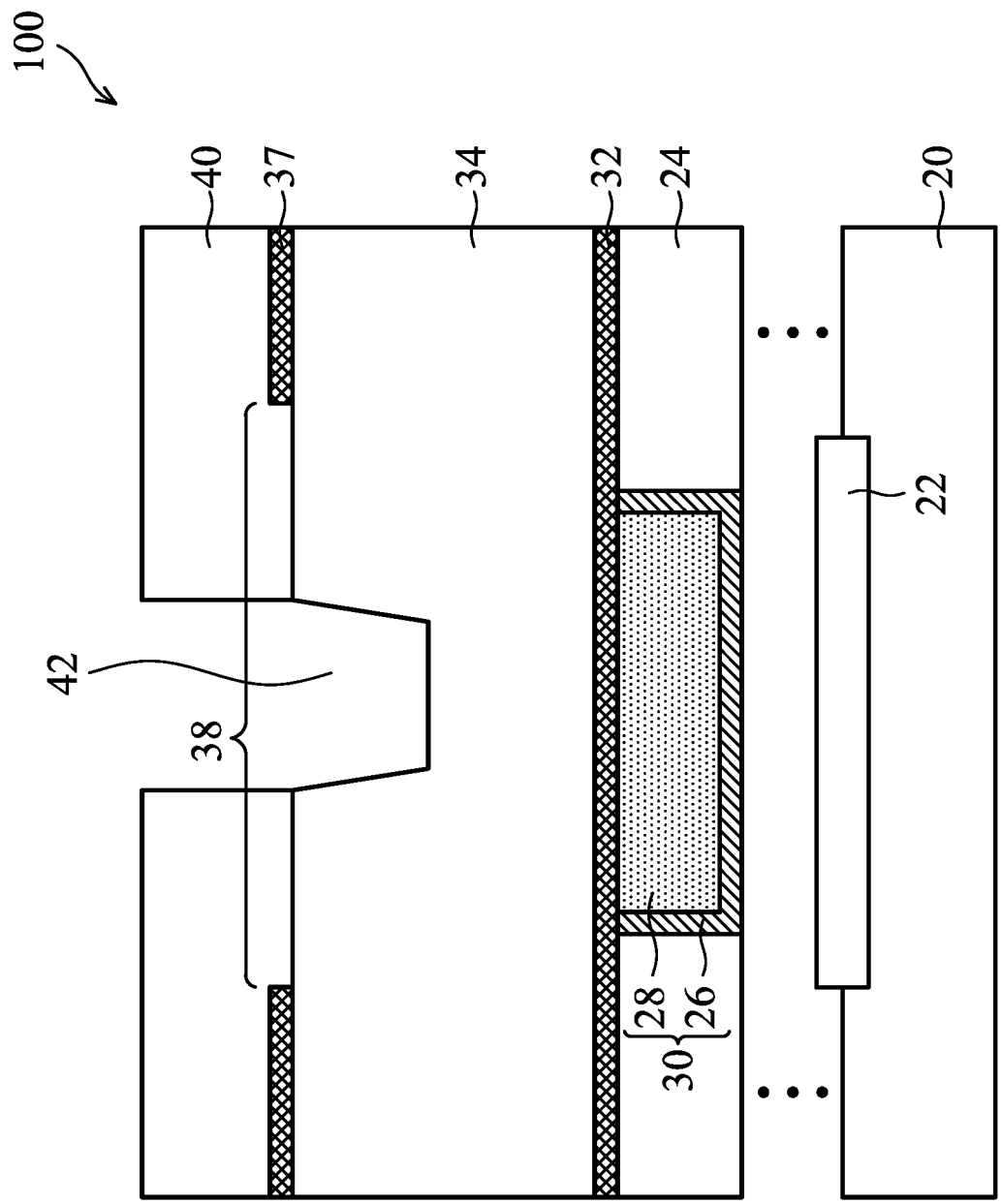
Figure 3:
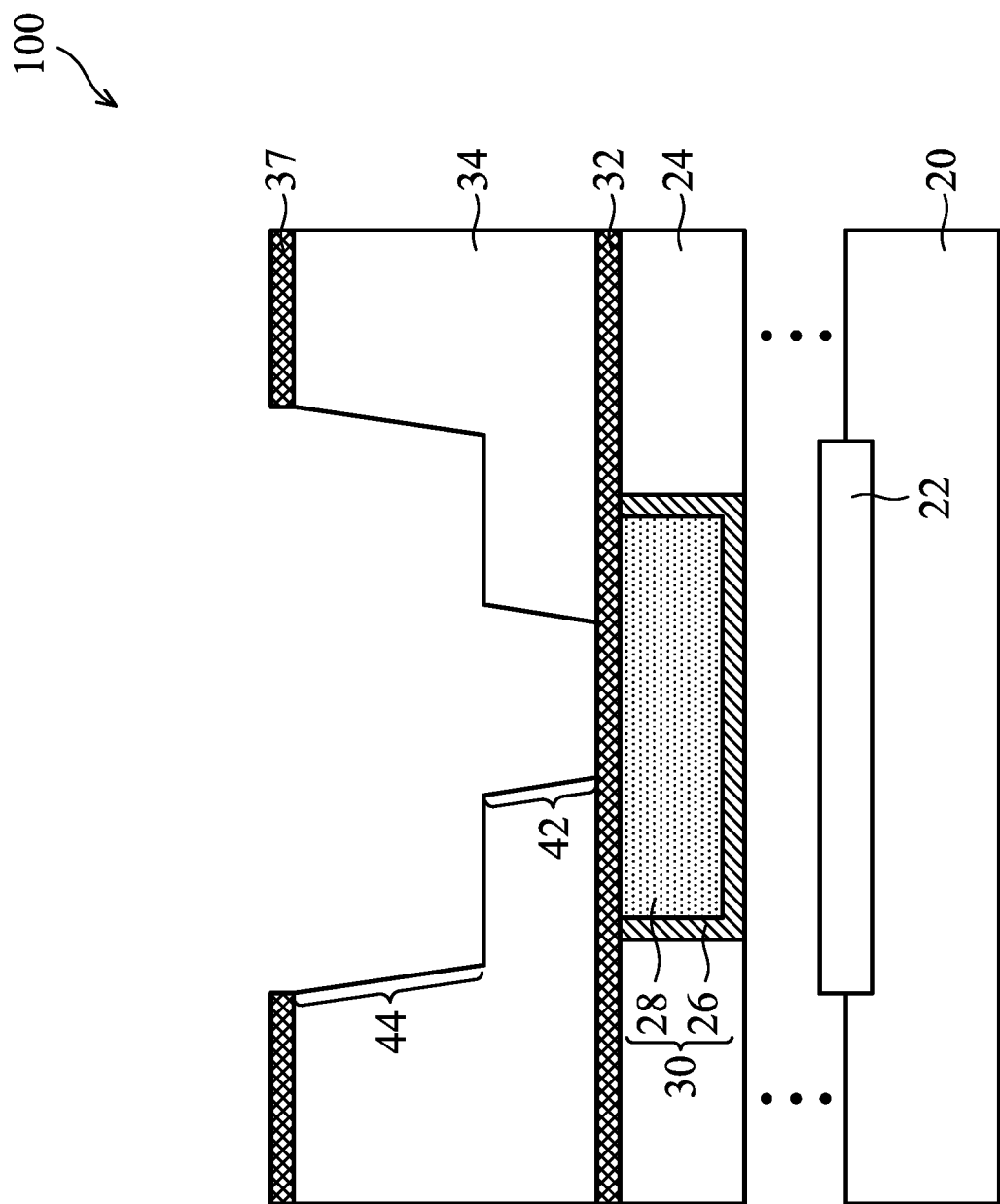

As shown in FIGS. 2 and 3, via opening 42 and trench 44 are formed through etching. The respective process is illustrated as process 206 in the process flow shown in FIG. 18. Via opening 42 and trench 44 may be formed using, for example, photolithography techniques. In an example of the formation process of via opening 42 and trench 44, metal hard mask 37 is first formed and patterned, as shown in FIG. 2. Metal hard mask 37 may be formed of titanium nitride, boron nitride, or the like. Metal hard mask 37 is patterned to form an opening 38 therein, wherein opening 38 defines the pattern of the trench that is to be filled to form a metal line. Next, photo resist 40 is formed on metal hard mask 37, and is then patterned to form an opening, through which dielectric layer 34 is formed. Dielectric layer 34 is then etched to form opening 42. In accordance with some embodiments of the present disclosure, the etching of dielectric layer 34 is performed using a process gas comprising fluorine and carbon, wherein fluorine is used for etching, with carbon having the effect of protecting the sidewalls of the resulting opening. With an appropriate fluorine and carbon ratio, opening 42 may have a desirable profile. For example, the process gases for the etching include a fluorine and carbon-containing gas(es) such as $C_4F_8$, $CH_2F_2$, and/or $CF_4$, and a carrier gas such as $N_2$. In an example of the etching process, the flow rate of $C_4F_8$ is in the range between about 0 sccm and about 50 sccm, the flow rate of $CF_4$ is in the range between about 0 sccm and about 300 sccm (with at least one of $C_4F_8$ having a non-zero flow rate), and the flow rate of $N_2$ is in the range between about 0 sccm and about 200 sccm. In accordance with alternative embodiments, the process gases for the etching include $CH_2F_2$ and a carrier gas such as $N_2$. In an example of the etching process, the flow rate of $CH_2F_2$ is in the range between about 10 sccm and about 200 sccm, and the flow rate of $N_2$ is in the range between about 50 sccm and about 100 sccm.

During the etching process, package component 100 may be kept at a temperature in the range between about 30° C. and about 60° C. In the etching process, plasma may be generated from the etching gases. The Radio Frequency (RF) power of the power source for the etching may be lower than about 700 Watts, and the pressure of the process gases is in the range from about 15 mTorr and about 30 mTorr.

The etching for forming opening 42 may be performed using a time-mode. As a result of the etching, opening 42 is formed to extend to an intermediate level between the top surface and the bottom surface of dielectric layer 34. Next, photo resist 40 is removed, followed by the further etching of dielectric layer 34 using metal hard mask 37 as an etching mask. In the etching process, which is an anisotropic etching process, opening 42 extends down until etch stop layer 32 is exposed. At the same time opening 42 is extended downwardly, trench 44 is formed to extend into dielectric layer 34, and the resulting structure is illustrated in FIG. 3. In the resulting structure, the final opening 42 is referred to as via opening 42, which is underlying and connected to trench 44.

In accordance with alternative embodiments, via opening 42 and trench 44 are formed in separate photo lithography processes. For example, in a first photo lithography process, via opening 42 is formed extending down to etch stop layer 32. In a second lithography process, trench 44 is formed. The order for forming via opening 42 and trench 44 may also be inversed.

Figure 4:
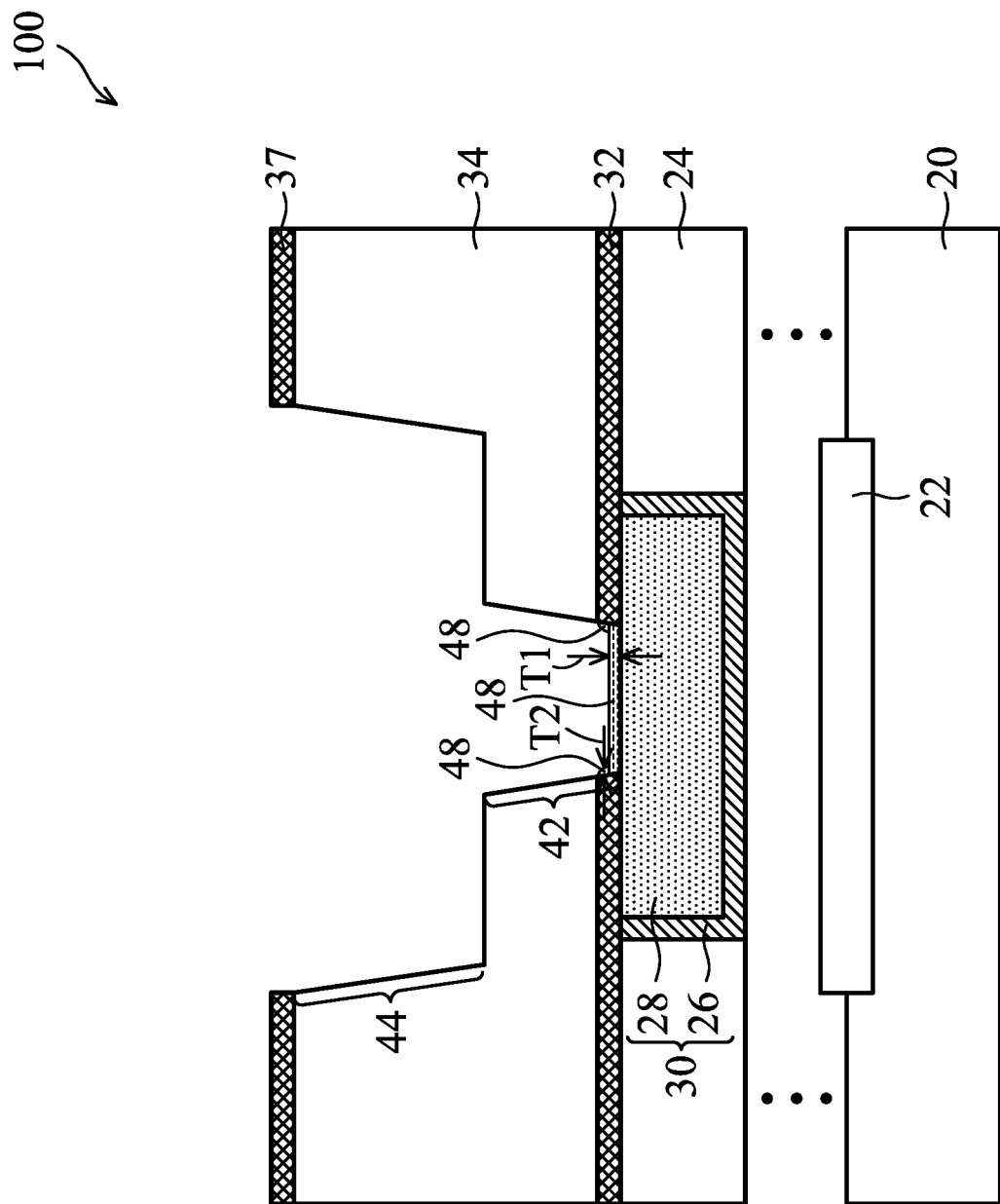

Next, referring to FIG. 4, etch stop layer 32 is etched-through. The respective process is illustrated as process 208 in the process flow shown in FIG. 18. The respective process may also be referred to as a wet clean process when the etching-through of etch stop layer 32 involves a wet etching. In accordance with some embodiments of the present disclosure, the etching solution includes glycol, dimethyl sulfide, amine, $H_2O_2$, and the like. Glycol may be used as a surfactant, dimethyl sulfide may be used as a solvent, amine may be used for removing undesirable organic substance on the surface of package component 100, and $H_2O_2$ and amine may be used etching etch stop layer 32.

Figure 10:
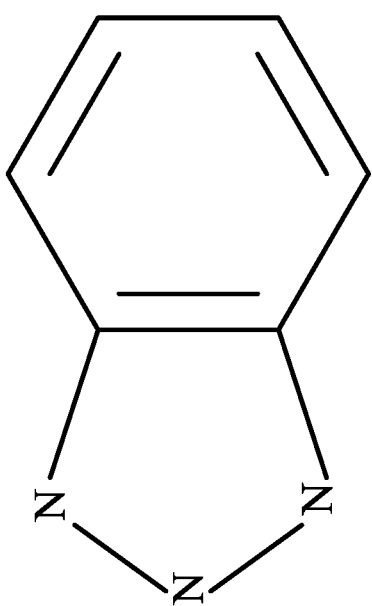
FIG. 10 illustrates a chemical structure of Benzotriazole (BTA) in accordance with some embodiments.

In addition to the above-recited chemicals, the etching solution may also include an inhibitor, which is used to protect the exposed portion of conductive filling material 28 (such as copper) from being undesirably etched once etch stop layer 32 is etched through. In accordance with some embodiments, the inhibitor includes benzotriazole (BTA). An example of the chemical structure of the BTA is illustrated in FIG. 10, which includes a benzo ring and three hydrogen atoms attached to the benzo ring. The chemical formula of the BTA is $C_6H_5N_3$.

Figure 11:
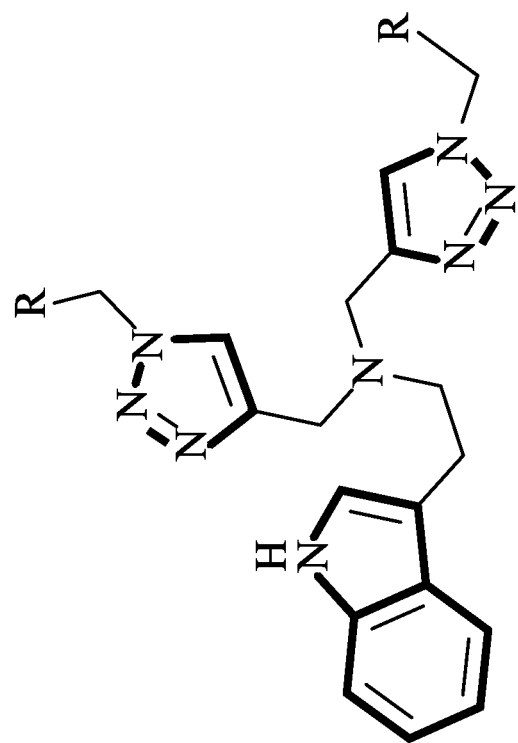
FIG. 11 illustrates a chemical structure of Bis-triazolyl indoleamine in accordance with some embodiments.

In accordance with other embodiments, the inhibitor is selected from other chemicals. These candidate inhibitor materials are hydrophobic, and are preferred to include non-polar groups. The hydrophobic property and the non-polar groups desirably make the candidate inhibitor materials difficult for the adsorption of precursor gases in subsequent deposition processes. The candidate inhibitor materials also have good chelation stability during and after the etching of etch stop layer 32, and during the subsequent deposition of the conductive barrier layer. Also, the candidate inhibitor materials are removable during the subsequent post-deposition treatment, as will be discussed. For example, bis-triazolyl indoleamine may be used as inhibitor also. An example of the chemical structure of bis-triazolyl indoleamine is illustrated in FIG. 11. In FIG. 11, the symbol "R" represents a phenol group. The benzo rings in bis-triazolyl indoleamine also results in the hydrophobic and steric hindrance property, which properties are desirable.

Figure 5:
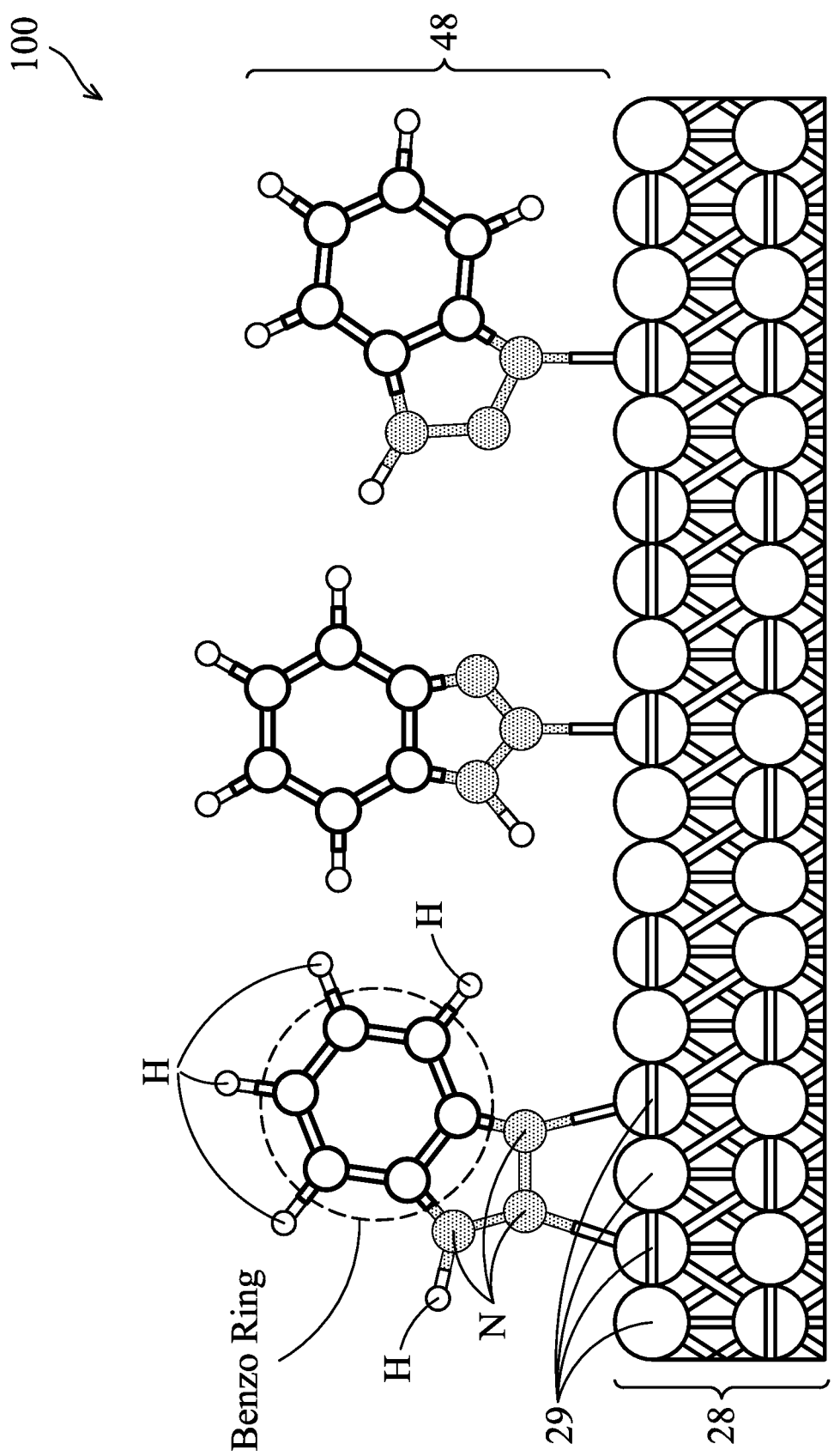

As a result of adding the inhibitor into the etching solution, the inhibitor has residue left on the exposed surface of conductive region 28 (such as copper), resulting in the formation of inhibitor film 48. Inhibitor film 48 is thin, and may have thickness T1 in the range between about 1 nm and about 2 nm, while the thickness T1 may be greater or smaller. The thickness T1 is related to the type of inhibitor. Inhibitor film 48 may be a mono layer of the inhibitor such as a mono layer of the BTA. FIG. 5 schematically illustrates a portion of the inhibitor film 48 and the underlying conductive region 28. For example, when conductive region 28 comprises copper, copper atoms 29 at the surface of conductive region 28 are bonded to the nitrogen atoms in the BTA. The benzo rings of the BTA face outwardly. Since the benzo rings are unable to be bonded to other atoms (such as Ta atoms and nitrogen atoms in subsequently formed conductive barrier layer), steric hindrance is resulted.

It is desired that inhibitor film 48 has a good coverage, for example, 100 percent, or at least 90 percent or greater, of the exposed portion of conductive region 28, so that no (or at least little) surface of conductive region 28 is exposed after the formation of inhibitor film 48. The increase in the coverage may be achieved by prolonging the time for etching the etch stop layer and/or increasing the concentration of the inhibitor in the etching solution. It is realized, however, the prolonging of the etching time and the increase in the concentration are limited by other factors. For example, prolonging the etching time too much may cause undercuts to be formed in etch stop layer 32, and increasing the concentration of inhibitor too much may cause the difficulty in etching the etch stop layer 32 due to the formation of the inhibitor film on etch stop layer 32. In accordance with some embodiments of the present disclosure, the etching time is in the range between about 50 seconds and about 100 seconds. The concentration of the inhibitor in the etching solution may be in the range between about 0.5 weight percent and about 1.0 weight percent.

In accordance with some embodiments of the present disclosure, to increase the coverage of the inhibitor film 48 without causing the problems as aforementioned, additional processes are performed. In an example of the processes, the etch stop layer 32 is first etched. The etching solution may adopt what is discussed in preceding paragraph, which includes the inhibitor and other chemicals. The etching time and the concentration of the inhibitor are not excessive. As a result, the coverage of the inhibitor film is less than 100 percent of the exposed surface of conductive region 28. For example, the coverage may be lower than about 50 percent. Next, package component 100 is taken out of the etching solution, followed by a cleaning process, for example, using de-ionized water, so that the residue etching solution is removed, while inhibitor film 48 is left unremoved. Next, an inhibitor film formation process is performed using an inhibitor-forming solution. Since this process is used for further growing inhibitor film 48, but not for etching etch stop layer 32, the chemicals that are used for etching etch stop layer 32 are not included in the inhibitor-forming solution. For example, amine and $H_2O_2$ may not be included. Some other chemicals such as glycol, dimethyl sulfide, etc., however, may be added in the inhibitor-forming solution. An inhibitor (such as BTA), which may be the same or different from the inhibitor used in the etching chemical of etch stop layer 32, is added into the inhibitor-forming solution. Package component 100 is then soaked in the inhibitor-forming solution to further grow, and to increase the coverage of, inhibitor film 48. In accordance with some embodiments of the present disclosure, the soaking time is in the range between about 30 seconds and about 60 seconds. The concentration of the inhibitor in the inhibitor-forming solution may be in the range between about 0.5 weight percent (wt %) and about 2.0 wt %. After the soaking, inhibitor film 48 may achieve 100 percent coverage, or substantially 100 percent coverage (for example, more than 95 percent or more than 99 percent coverage).

Referring back to FIG. 4, at the same time inhibitor film 48 is formed on the surface of conductive region 28, inhibitor film 48 may also be formed on the (sidewall) surface of etch stop layer 32, with the corresponding portion of inhibitor film 48 having thickness T2 smaller than thickness T1. The coverage of the corresponding portion of inhibitor film 48 on the sidewalls of etch stop layer 32 may be smaller than 100 percent, for example, smaller than about 50 percent, and is also smaller than the coverage on conductive region 28. There is no inhibitor film 48 grown on the exposed surface of dielectric layer 34. There may be, or may not be, inhibitor film 48 grown on metal hard mask 37. Also, when inhibitor film 48 is grown on metal hard mask 37, its thickness is smaller than thickness T1, and/or the coverage of the portions of inhibitor film 48 on metal hard mask 37 is smaller than 100 percent, for example, smaller than about 50 percent.

Figure 6:
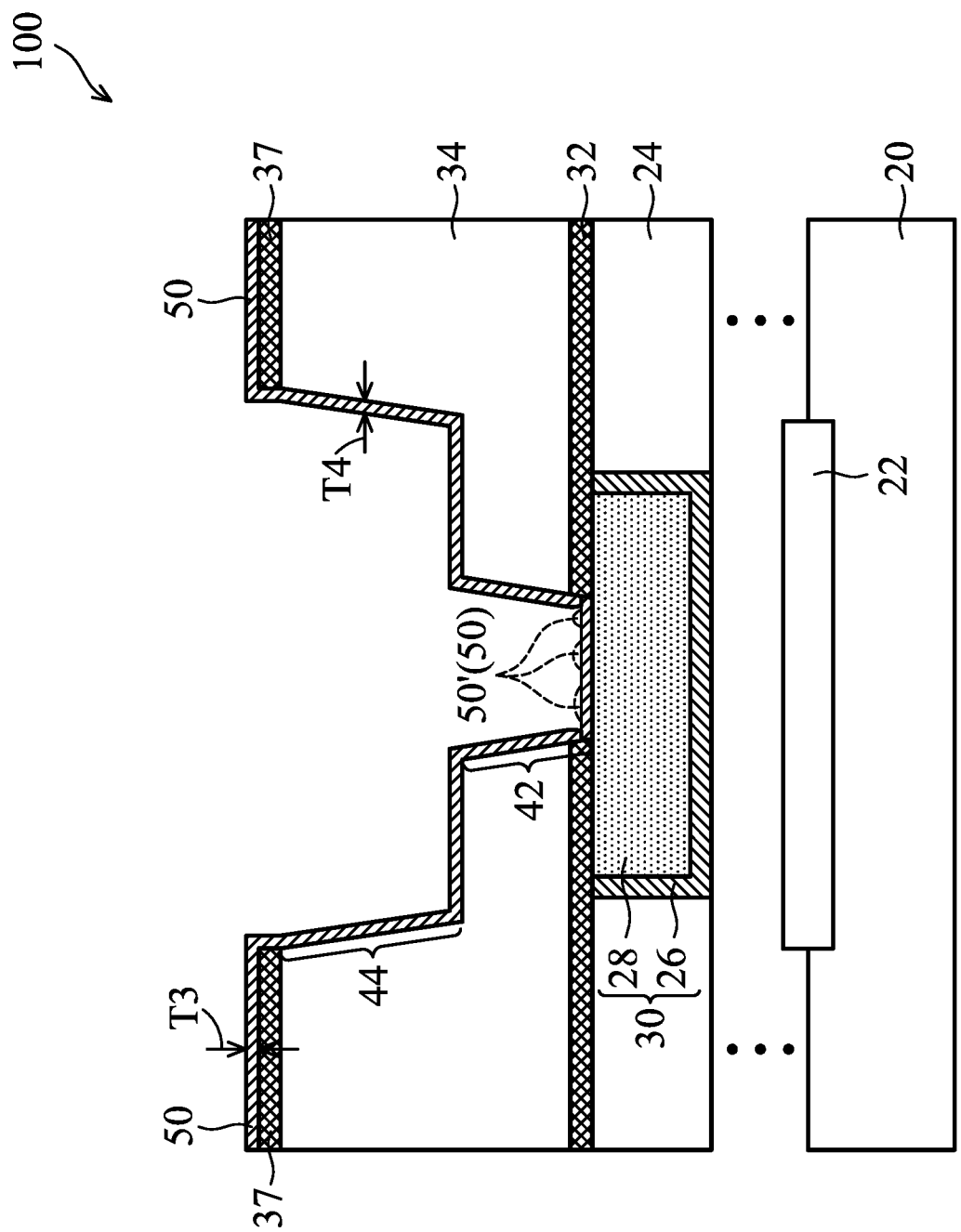

Next, referring to FIG. 6, conductive barrier layer 50 is deposited lining via opening 42 and trench 44, for example, using Atomic Layer Deposition (ALD). The respective process is illustrated as process 210 in the process flow shown in FIG. 18. Conductive barrier layer 50 may include titanium, titanium nitride, tantalum, tantalum nitride, or the like, and has the function of preventing copper in the subsequently deposited copper-containing material 56 (FIG. 9) from diffusing into dielectric layer 34. In accordance with some embodiments of the present disclosure, conductive barrier layer 50 comprises TaN formed using ALD. The corresponding ALD cycle includes conducting a Ta-containing process gas such as Pentakis Dimethylamino Tantalum ($C_{10}H_{30}N_5Ta$) into the respective ALD chamber, purging the Ta-containing process gas, conducting a nitrogen-containing process gas such as ammonia into the process chamber, and purging the nitrogen-containing process gas. There are a plurality of ALD cycles. After the formation of conductive barrier layer 50, thickness T4 of the portion of conductive barrier layer 50 on the sidewalls of dielectric layer 34 is great enough to act as a diffusion barrier. For example, thickness T4 may be greater than about 15 Å.

An example of the reaction equations for forming TaN is as follows:

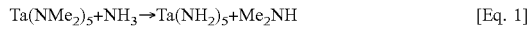
$$Ta(NMe_2)_5 + NH_3 \rightarrow Ta(NH_2)_5 + Me_2NH \quad [Eq. 1]$$

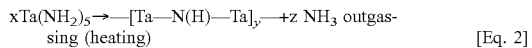
$$xTa(NH_2)_5 \rightarrow -[Ta-N(H)-Ta]_y - +z\ NH_3\ \text{outgassing (heating)} \quad [Eq. 2]$$

Wherein "Me" represents methyl groups ($CH_3$). In accordance with other embodiments, the conductive barrier layer 50 may comprise other materials such as TiN. The corresponding process gases may include tetrakis dimethylamido titanium and ammonia, for example, which may be used in ALD cycles to form TiN.

Inhibitor film 48 delays the growth of conductive barrier layer 50. This is due to the steric hindrance of the inhibitor film 48, and the steric hindrance is at least partially due to its heterocyclic structure. For example, on inhibitor film 48, there is a very small possibility of having a TaN molecule (assuming conductive barrier layer 50 comprises TaN) grown thereon in a ALD cycle, while on dielectric layer 34, a full layer of TaN is grown in each ALD cycle. Accordingly, after one ALD cycle, a very small percentage of the exposed surface of inhibitor film 48 has the TaN grown thereon, which acts as the seed for the subsequent growth. Once the TaN is grown, the TaN will grow at the same rate as on dielectric layer 34. After each cycle, a very small additional area of inhibitor film 48 is covered by the newly grown TaN. Accordingly, a large percent of the inhibitor film 48 does not have TaN grown thereon until after multiple ALD cycles. This effect is referred to as growth delay (or incubation delay) on the inhibitor film 48, while there is no grow delay on dielectric layer 34 since no inhibitor film 48 is formed on dielectric layer 34. There is a delay of the growth of conductive barrier layer 50 on the exposed surfaces of etch stop layer 32 and metal hard mask 37, and the growth delay is less significant than the growth delay directly over conductive region 28.

Figure 12:
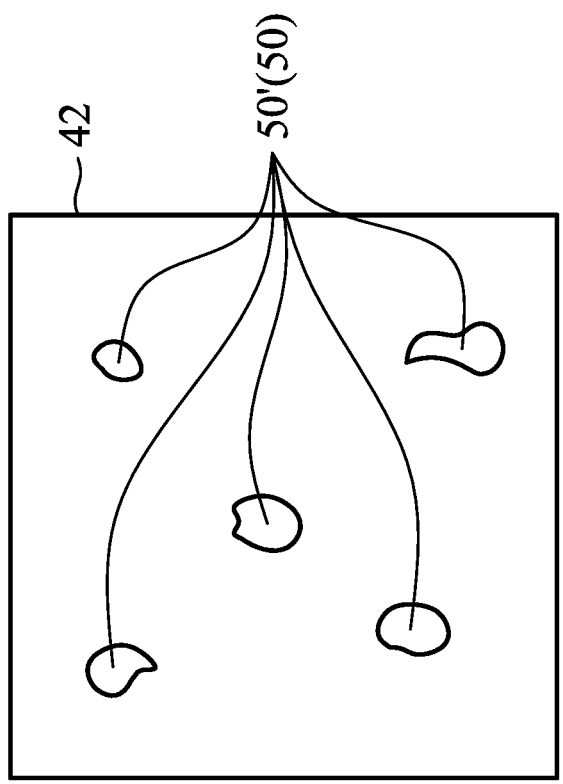
FIG. 12 illustrates a schematic top view of discrete portions of a conductive barrier layer at the bottom of a via opening in accordance with some embodiments.

Due to the growth delay, and the random seeding of conductive barrier layer 50 on inhibitor film 48, after the formation of conductive barrier layer 50 is finished, there may be substantially no conductive barrier layer 50 grown on inhibitor film 48. Alternatively stated, conductive barrier layer 50 may not extend onto conductive region 28. It is possible that a small amount of conductive barrier layer 50 is grown on inhibitor film 48, with the coverage smaller than 100 percent and higher than 0 percent. In accordance with some embodiments, the coverage is in the range between about 20 percent and about 80 percent, or in the range between about 40 percent and about 60 percent. Conductive barrier layer 50 also forms discrete islands 50' on the surface of conductive region 28, which have random and irregular patterns. For example, FIG. 12 schematically illustrates a top view of the randomly formed islands 50' of conductive barrier layer 50, which is viewed through via opening 42.

Figure 7:
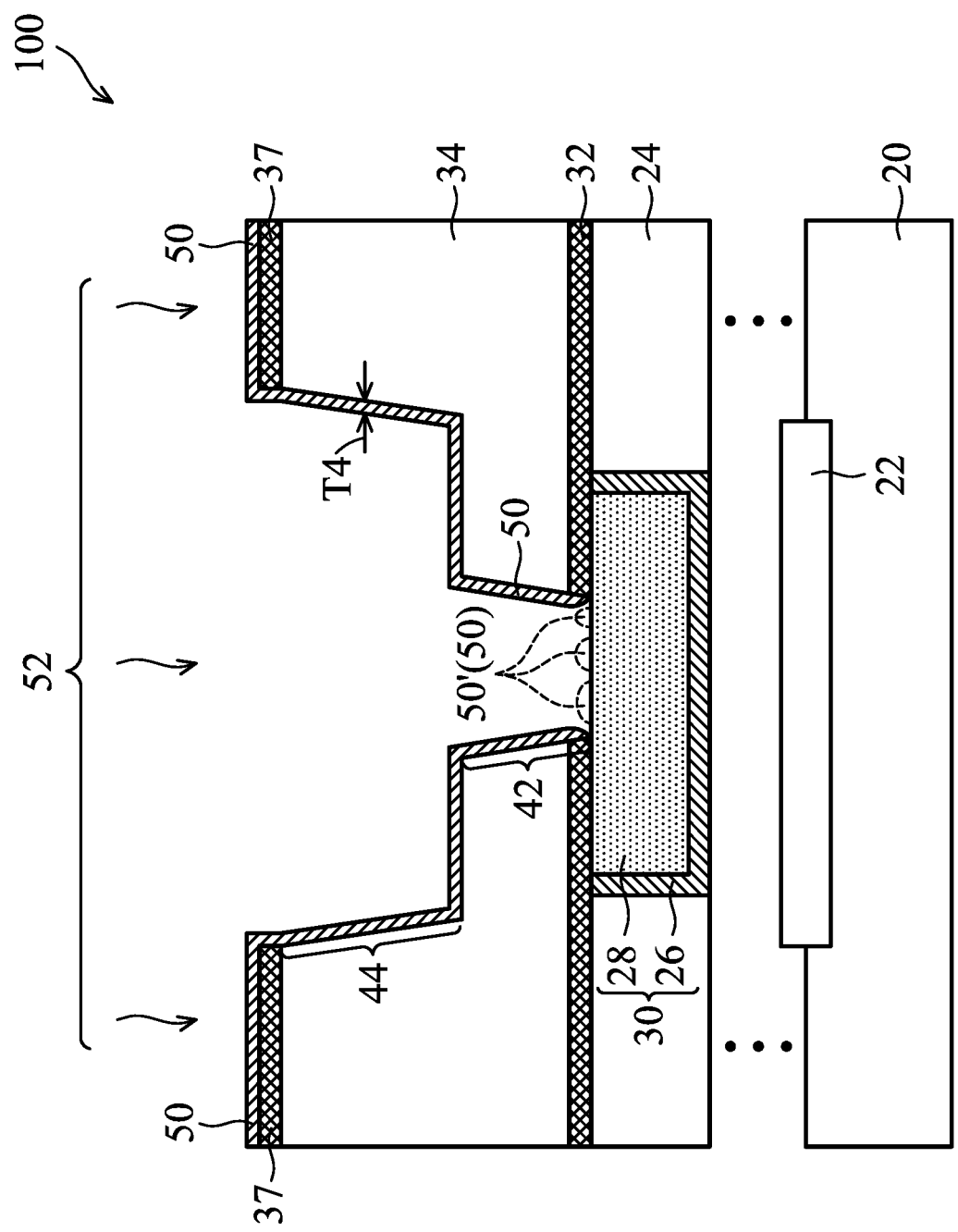

A post-deposition treatment 52 is performed to remove inhibitor film 48. The respective process is illustrated as process 212 in the process flow shown in FIG. 18. The resulting structure is illustrated in FIG. 7. The post-deposition treatment 52 may be performed through a plasma treatment and/or a thermal treatment. The process gas may include hydrogen ($H_2$) and a carrier gas such as argon. In accordance with some embodiments of the present disclosure, a plasma treatment is performed. During the plasma treatment, the temperature of the package component 100 may be higher than about 200° C., for example, in the range between about 200° and about 300° C. The treatment duration may be in the range between about 30 seconds and about 60 seconds. In accordance with alternative embodiments of the present disclosure, a thermal treatment is performed (with no plasma being generated). During the thermal treatment, the temperature of the package component 100 may be higher than about 300° C., for example, in the range between about 300° and about 350° C. The treatment duration may be in the range between about 30 seconds and about 60 seconds.

As a result of the post-deposition treatment, inhibitor film 48 is removed. The resulting structure is shown in FIG. 7. In the post-deposition treatment, inhibitor film 48 is decomposed into gases, which are removed. In addition, the oxide of conductive region 28, if any, is reduced back to elemental metal. With the inhibitor film 48 being removed, the islands 50' of conductive barrier layer 50 land on conductive region 28.

An advantageous feature of performing the post-deposition treatment after the deposition of conductive barrier layer 50 is that conductive barrier layer 50 is condensed by the post-deposition treatment. By increasing the density of conductive barrier layer 50, its ability of blocking the diffusion of the material (such as copper) in conductive region 56 (FIG. 9) into dielectric layer 34 is improved.

Figure 8:
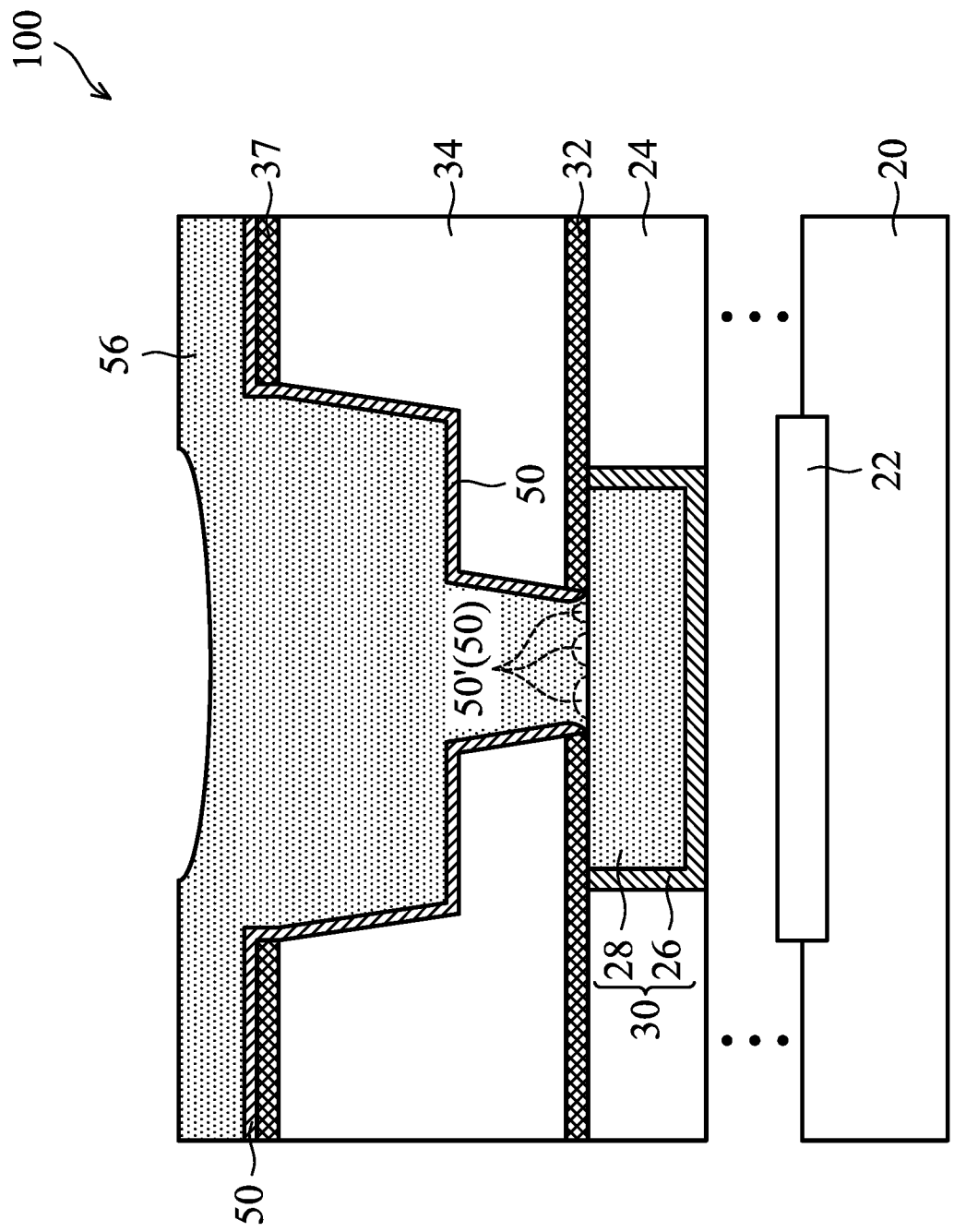
Figure 9:
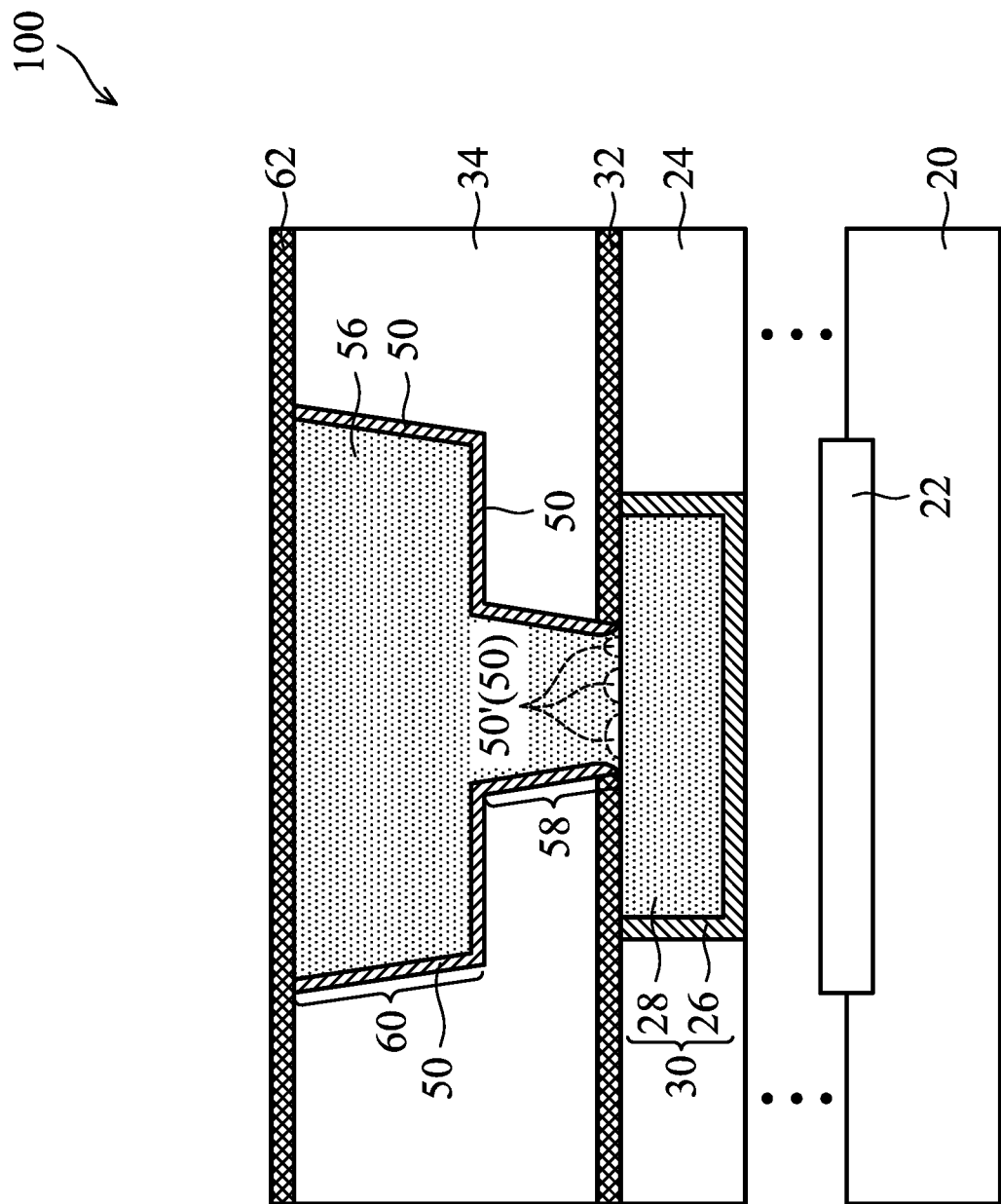

Referring to FIG. 8, conductive material 56 is deposited to fill via opening 42 and trench 44. The respective process is illustrated as process 214 in the process flow shown in FIG. 18. The processes as shown in FIGS. 6 and 7 may be in-situ performed in a same vacuum environment, with not vacuum break in between. A part or all of the deposition process in FIG. 8 may also be performed in-situ in the same vacuum environment as the processes shown in FIGS. 6 and 7, with no vacuum break in between. In accordance with some embodiments, the deposition of conductive material 56 includes performing a blanket deposition to form a metal seed layer (which may be a copper layer) using Physical Vapor Deposition (PVD), and filling the rest of via opening 42 and trench 44 using, for example, electro-plating, electroless plating, deposition, or the like. A planarization process such as a Chemical Mechanical Planarization (CMP) process or a mechanical polish process may be performed to remove excess portions of conductive material 56, hence forming via 58 and metal line 60, as shown in FIG. 9. Each of via 58 and metal line 60 includes a portion of conductive barrier layer 50 and a portion of conductive material 56.

In the resulting structure, islands 50' (FIG. 9) may be isolated from each other by conductive region 28 and conductive material 56, and islands 50' are in contact with conductive region 28 and conductive material 56. Depending on the materials and the formation processes of conductive region 28 and conductive material 56, the interface between conductive region 28 and conductive material 56 may or may not be distinguishable. Islands 50' may be in physical contact with the interface.

As shown in FIG. 9, due to the selective formation of conductive barrier layer 50, conductive barrier layer 50 includes the portions contacting dielectric layer 34 to perform the diffusion-blocking function, and does not have significant portions to separate the conductive material 56 in via 58 from conductive region 28. Since the resistivity of conductive barrier layer 50 is significantly higher (such as two orders to four orders higher) than the resistivity of conductive material 56, not forming conductive barrier layer 50 on conductive region 28 may significantly reduce the contact resistance of via 58.

FIG. 9 also illustrates the formation of dielectric etch stop layer 62, which covers and contacts dielectric layer 34 and metal line 60. The respective process is illustrated as process 216 in the process flow shown in FIG. 18. In accordance with some embodiments, dielectric etch stop layer 62 is formed of a metal oxide, a metal nitride, a metal carbo nitride, silicon nitride, combinations thereof, and/or multi-layers thereon.

Figure 14:
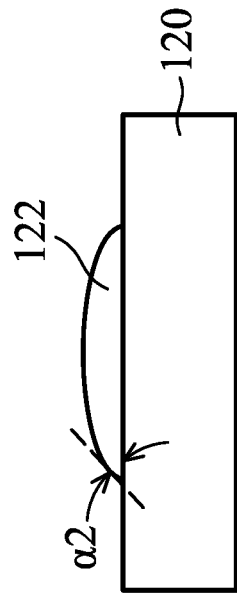
FIG. 14 illustrates a contact angle of water with a bare copper surface in accordance with some embodiments.
Figure 13:
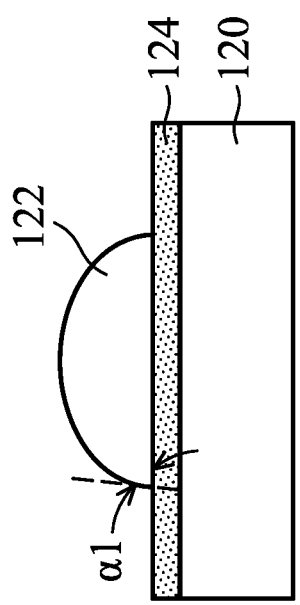
FIG. 13 illustrates a contact angle of water with a BTA surface in accordance with some embodiments.

FIG. 13 demonstrates the hydrophobic property of inhibitor film 124 when it is formed of BTA. Layer 120 is a copper layer. Inhibitor film 124 is formed on copper layer 120, and is formed of BTA. Water droplet 122 is dispensed on inhibitor film 124. The contact angle α1 is about 60, indicating the inhibitor film 124 is hydrophobic. As comparison, FIG. 14 illustrates that when water droplet 122 is disposed on copper layer 120 directly, the contact angle α2 is about 20 degrees. This reveals that inhibitor film 124 is significantly more hydrophobic than copper. Accordingly, the growth delay of conductive barrier layer 50 on inhibitor film 48 is more significant than on bare copper. This proves that the effect of depositing conductive barrier layer 50 on inhibitor film 48 results in more significant growth delay than on bare copper.

Figure 15:
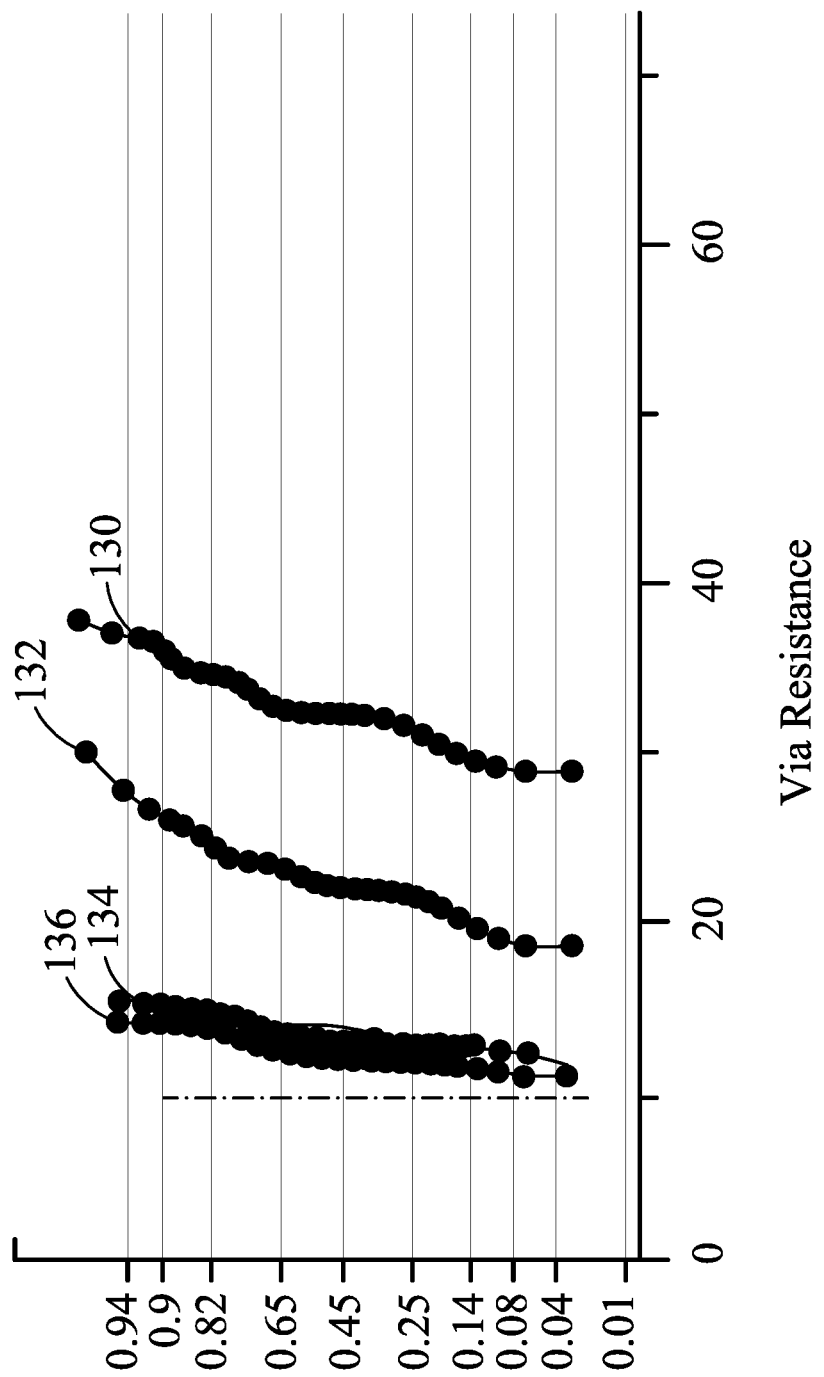
FIG. 15 illustrates experimental results revealing resistance values of vias formed by a plurality of formation processes in accordance with some embodiments.

FIG. 15 illustrates the normalized via contact resistance values of a plurality of via samples, wherein the cumulative percentages of the samples are illustrated as a function of the via resistance values. A plurality of samples are formed, with some of the formation process including pre-clean using $H_2$, which results in the full or partial removal of inhibitor film (if any) in the samples. The data marked as 130 are obtained from the sample vias formed through performing pre-clean (to fully remove the inhibitor film), followed by depositing a TaN layer through PVD. The data marked as 132 are obtained from the sample vias formed through performing pre-clean (to fully remove the inhibitor film), followed by forming a TaN layer through ALD and then performing a plasma treatment using $H_2$. The data marked as 134 are obtained from the sample vias formed through performing weak pre-clean (to partially remove the inhibitor film), followed by forming a TaN layer, and then performing a plasma treatment using $H_2$. The data marked as 136 are obtained from the sample vias formed by adopting the embodiments of the present disclosure. The results indicate that the embodiments of the present disclosure have lowest resistance values. Furthermore, comparing the results of samples 130, 132, 134, and 136, it was revealed that the via contact resistance is directly related to the amount of inhibitor film left when the TaN layer is deposited, and the more inhibitor film is left, the deposition of the TaN layer is more selective, and the lower via contact resistance is achieved. This is revealed by the low contact resistance values of samples 134 and 136 compared to the high contact resistance values of samples 130 and 132.

Figure 16:
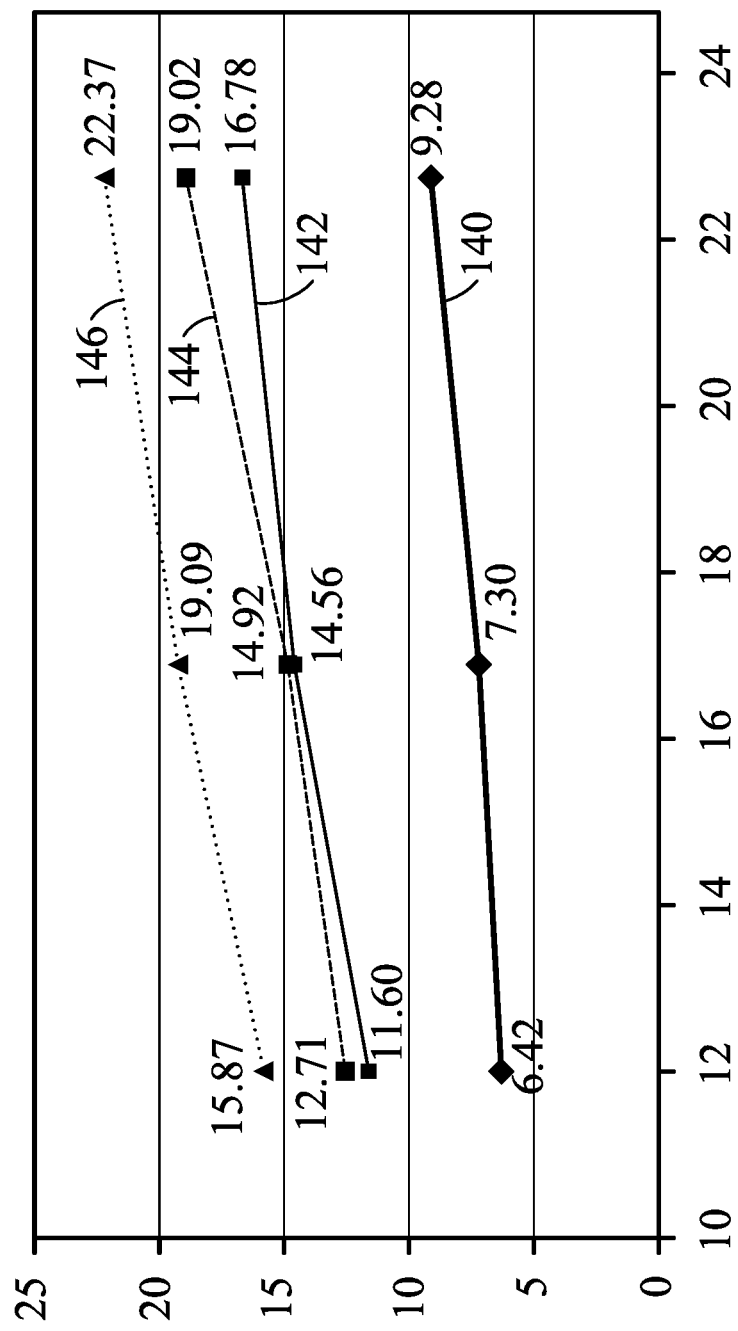
FIG. 16 illustrates the growth delay of barrier layers formed in a plurality of formation processes in accordance with some embodiments.

FIG. 16 illustrate the thicknesses of the TaN layers deposited on different surfaces when ALD is used. The Y-axis represents the thickness of the TaN layers. The X-axis represents the number of ALD cycles. Line 140 represents the results obtained from the samples formed by depositing TaN layers on BTA films. Line 142 represents the results obtained from the samples formed by forming BTA films, performing pre-clean to remove the BTA films, and then depositing the TaN layers. Line 144 represents the results obtained from the samples formed by depositing the TaN layers on bare copper. Line 146 represents the results obtained from the samples formed by depositing the TaN layers on the oxidized copper ($Cu_2O$) or bare copper exposed to air (with CuOH at surface). It is shown that line 140 corresponds to the lowest thickness, indicating the significant growth delay of the TaN layers on BTA. Furthermore, line 142 indicates that the remaining BTA's has effect on the growth-delay of the TaN layer.

Table 1 illustrates the results in a table format, which results are also shown in FIG. 16. The check marks in the fields "wet" and "pre-clean" indicate whether the wet clean (with BTA film formed) is performed or not, and whether the pre-clean, in which the BTA film (if formed) is removed, is performed or not. For the data corresponding to samples 140, BTA films are not formed and pre-clean is also not performed. For the data corresponding to samples 142, BTA films are not formed, while the pre-clean is performed. For the data corresponding to samples 144, BTA films are formed and not removed when the TaN layer is formed. For the data corresponding to samples 146, BTA films are formed and then removed in pre-clean before the TaN layers are formed. The TaN thickness after 17 ALD cycles for line 144 is 7.3 Å, which is a half of the line 146, in which the formed BTA films are removed before the formation of the TaN layers. This proves the effect of the BTA film in delaying/reducing the growth of the TaN. Also, the slope of samples 144 is significantly smaller than other samples. Indicating the growth rate of samples 144 is lower than other samples.

TABLE 1

| | Process | | Data | |
|---|---|---|---|---|
| | Wet | Pre-clean | Slope | Thickness (Å) |
| 140 | | | 0.589 | 19.09 |
| 142 | | x | 0.577 | 14.92 |
| 144 | x | | 0.262 | 7.3 |
| 146 | x | x | 0.468 | 14.56 |

Figure 17:
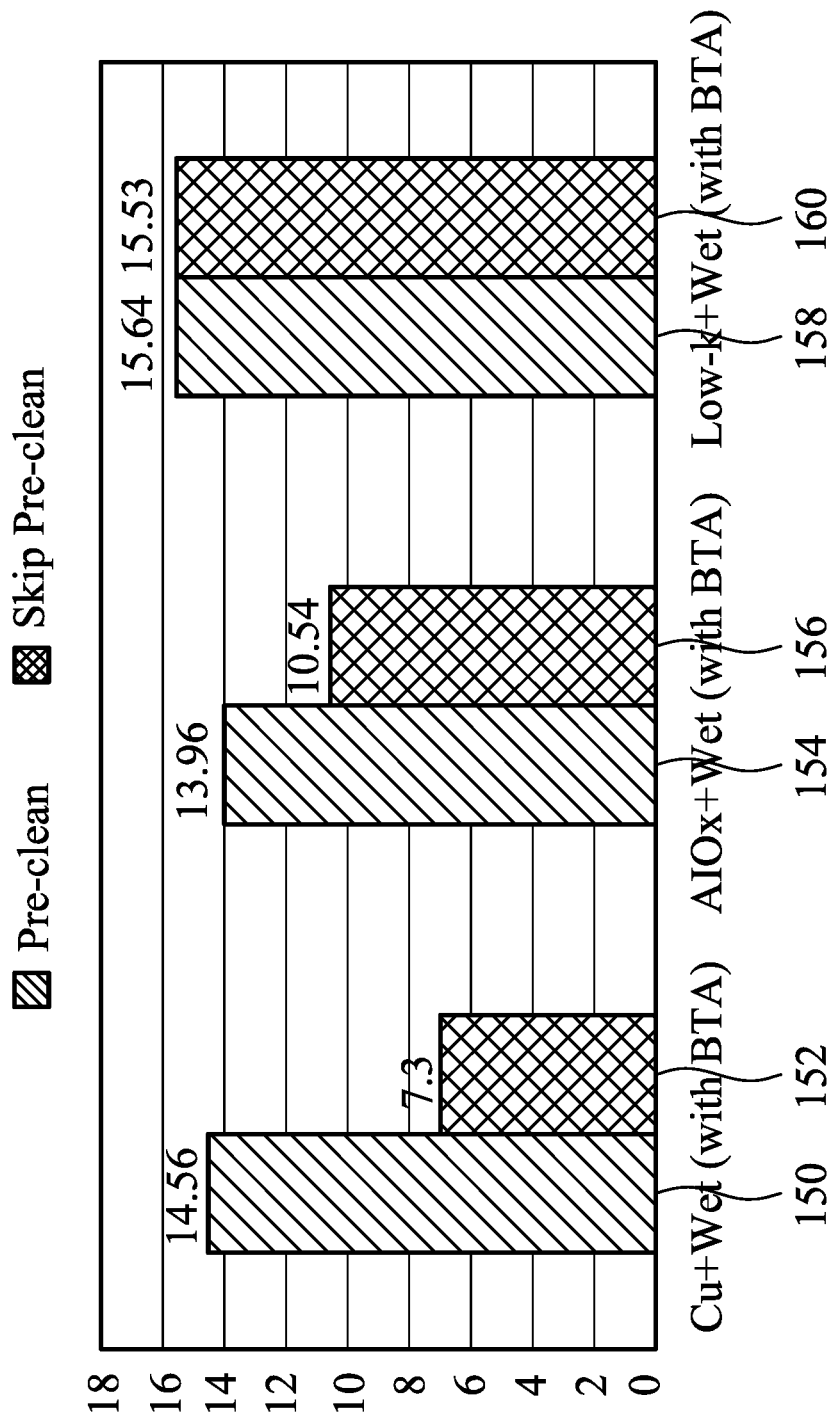
FIG. 17 illustrates the comparison of thicknesses of conductive barrier layers on different surfaces (and formed by different processes) in accordance with some embodiments.

FIG. 17 illustrate the comparison of the thicknesses of TaN layers on different surfaces, with the thicknesses of TaN layers on copper, aluminum oxide, and low-k dielectric illustrated. Bar 150 represents the thickness of TaN grown on copper, with the BTA film removed through pre-clean prior to the TaN deposition. Bar 152 represents the thickness of TaN grown on a BTA film formed on copper. Bar 154 represents the thickness of TaN grown on aluminum oxide, with the BTA film removed through pre-clean prior to the TaN deposition. Bar 156 represents the thickness of TaN grown on a BTA film formed on aluminum oxide. Bar 158 represents the thickness of TaN grown on a low-k dielectric layer, with no BTA film removed (since no BTA is formed on low-k). Bar 160 represents the thickness of TaN grown on a low-k dielectric layer (with no BTA formed also). Comparing bar 150 to bar 152, bar 154 to bar 156, and bar 158 to bar 160, it is shown that inhibitor films cause significant delay of the growth of TaN layers on copper, the partial-coverage inhibitor film on the aluminum film causes some but smaller growth delay of TaN layers on aluminum oxide, and there is no growth delay of TaN layers on low-k dielectric layer since no BTA film is formed on the low-k dielectric layer. FIG. 17 explains the different growth delay behavior on conductive region 28, etch stop layer 32, and low-k dielectric layer 34 (FIG. 6).

The embodiments of the present disclosure have some advantageous features. By forming the conductive barrier layer after the formation of the inhibitor film, since the growth of the inhibitor film on different materials is selective, the resulting conductive barrier layer is selectively formed on the sidewalls of the low-k dielectric layer to perform the diffusion-blocking function, and is not (or substantially not) formed on the underlying conductive region to cause the undesirable increase in the via contact resistance. In addition, by performing the post-deposition treatment after the formation of the conductive barrier layer, not only the inhibitor film is removed, the conductive barrier layer is also condensed, and the diffusion-blocking ability is improved. In conventional processes, pre-clean processes, which may be performed using $H_2$, is performed prior to the formation of conductive barrier layers to reduce oxides, and do not have the function of condensing the conductive barrier layers.

In accordance with some embodiments of the present disclosure, a method of forming an integrated circuit structure comprises forming an etch stop layer over a conductive feature; forming a dielectric layer over the etch stop layer; forming an opening in the dielectric layer to reveal the etch stop layer; etching the etch stop layer through the opening using an etchant comprising an inhibitor, wherein an inhibitor film comprising the inhibitor is formed on the conductive feature; depositing a conductive barrier layer extending into the opening; after the conductive barrier layer is deposited, performing a treatment to remove the inhibitor film; and depositing a conductive material to fill a remaining portion of the opening. In an embodiment, the method further comprises, after the etch stop layer is etched, soaking a respective wafer comprising the etch stop layer and the inhibitor film in a chemical solution to increase a thickness of the inhibitor film, wherein during the soaking, the etch stop layer is not etched. In an embodiment, the etchant and the chemical solution comprises a same type of inhibitor. In an embodiment, the treatment comprises a plasma treatment using hydrogen ($H_2$) as a process gas. In an embodiment, the treatment comprises a thermal treatment using hydrogen ($H_2$) as a process gas. In an embodiment, the inhibitor in the etchant comprises Benzotriazole, and the conductive feature comprises copper. In an embodiment, the conductive barrier layer form isolated islands on the inhibitor film. In an embodiment, after the treatment, the isolated islands are in contact with an interface between the conductive feature and the conductive material. In an embodiment, the discrete islands are in contact with an interface between the conductive feature and the conductive material.

In accordance with some embodiments of the present disclosure, a method of forming an integrated circuit structure includes forming an etch stop layer over a conductive feature; forming a dielectric layer over the etch stop layer; forming an opening in the dielectric layer to reveal the etch stop layer; etching the etch stop layer; and selectively depositing a conductive barrier layer extending into the opening, wherein the selective depositing results in the conductive barrier layer to have a first thickness on a sidewall of the dielectric layer, and the conductive barrier layer is at least thinner at a bottom of the opening than on the sidewall of the dielectric layer. In an embodiment, the conductive barrier layer comprises discrete islands at the bottom of the opening. In an embodiment, the conductive barrier layer does not extend to the bottom of the opening. In an embodiment, the etching the etch stop layer results in an inhibitor film to be formed on a top surface of the conductive feature, and the method further comprises: after the conductive barrier layer is formed, removing the inhibitor film; and depositing a conductive material to fill a remaining portion of the opening. In an embodiment, the removing the inhibitor film comprises a plasma treatment using hydrogen ($H_2$) as a process gas. In an embodiment, the removing the inhibitor film comprises a thermal treatment using hydrogen ($H_2$) as a process gas.

In accordance with some embodiments of the present disclosure, an integrated circuit structure comprises a conductive feature; an etch stop layer over the conductive feature; a dielectric layer over the etch stop layer; and a conductive feature extending into the dielectric layer and the etch stop layer, wherein the conductive feature comprises: a conductive barrier layer comprising a first portion on sidewalls of the dielectric layer, wherein the first portion forms a continuous layer, and second portions on a top surface of the first conductive feature, wherein the second portions are thinner than the first portion; and a conductive region encircled by the first portions of the conductive barrier layer, wherein the conductive region is over and contacting the second portions of the conductive barrier layer. In an embodiment, the second portions are discrete islands separated from each other by the conductive region. In an embodiment, the discrete islands are at, and in contact with, an interface between the conductive feature and the conductive region. In an embodiment, the conductive barrier layer comprises TaN. In an embodiment, the conductive barrier layer has a coverage smaller than about 50 percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a first conductive feature;
   an etch stop layer over the first conductive feature;
   a dielectric layer over the etch stop layer; and
   a second conductive feature extending into the dielectric layer and the etch stop layer, wherein the second conductive feature comprises:
      a conductive barrier layer comprising:
         a first portion on sidewalls of the dielectric layer, wherein the first portion forms a continuous layer, wherein the first portion of the conductive barrier layer has a thickness; and
         second portions on a top surface of the first conductive feature, wherein the second portions of the conductive barrier layer are discrete islands separated from each other, and have a maximum thickness, and wherein the maximum thickness is smaller than the thickness of the first portion; and
      a conductive region encircled by the first portions of the conductive barrier layer, wherein the conductive region is over and contacting the second portions of the conductive barrier layer.

2. The integrated circuit structure of claim 1, wherein the discrete islands are at, and are in contact with, an interface between the first conductive feature and the conductive region.

3. The integrated circuit structure of claim 1, wherein the first conductive feature and the conductive region form a distinguishable interface in between, and wherein the second portions of the conductive barrier layer are joined to the distinguishable interface.

4. The integrated circuit structure of claim 1, wherein the first conductive feature and the conductive region are continuously joined with each other, without forming a distinguishable interface in between.

5. The integrated circuit structure of claim 1, wherein the conductive barrier layer comprises titanium nitride.

6. The integrated circuit structure of claim 1, wherein the second portions of the conductive barrier layer have a coverage smaller than about 50 percent.

7. The integrated circuit structure of claim 1, wherein the second portions are physically spaced apart from the first portion.

8. The integrated circuit structure of claim 1, wherein the maximum thickness is between about 40 percent and about 60 percent of the thickness of the first portion of the conductive barrier layer.

9. The integrated circuit structure of claim 1, wherein a bottommost end of the first portion of the conductive barrier layer is higher than, and is spaced apart from, the first conductive feature.

10. The integrated circuit structure of claim 1, wherein the conductive barrier layer is substantially free from silicon therein.

11. An integrated circuit structure comprising:
    a conductive feature;
    an etch stop layer over the conductive feature;
    a dielectric layer over the etch stop layer; and
    a conductive barrier layer extending into the dielectric layer, wherein the conductive barrier layer comprises:
       first portions over and contacting the conductive feature, wherein the first portions of the conductive barrier layer are separated from each other; and
       second portions on sidewalls of the dielectric layer, wherein a maximum thickness of the first portions of the conductive barrier layer is smaller than thicknesses of the second portions of the conductive barrier layer, and wherein an entirety of the first portions and an entirety of the second portions are formed of a same homogenous material.

12. The integrated circuit structure of claim 11 further comprising:
    a conductive region over and physically contacting both of the conductive feature and the first portions of the conductive barrier layer.

13. The integrated circuit structure of claim 11, wherein the conductive barrier layer is formed of a different conductive material than the conductive feature.

14. The integrated circuit structure of claim 11, wherein the first portions of the conductive barrier layer are laterally spaced apart from both of the dielectric layer and the etch stop layer.

15. The integrated circuit structure of claim 11, wherein the conductive feature comprises copper, and wherein the conductive barrier layer comprises titanium nitride.

16. The integrated circuit structure of claim 11, wherein the conductive barrier layer is substantially free from silicon therein.

17. An integrated circuit structure comprising:
    a metal line;
    a dielectric layer over the metal line;
    a conductive barrier layer extending into the dielectric layer, wherein the conductive barrier layer comprises a portion on sidewalls of the dielectric layer;
    a plurality of isolated islands over the metal line, wherein the plurality of isolated islands comprise a first material free from silicon therein; and
    a metal via over and contacting the metal line, wherein the metal via and the metal line in combination isolate the plurality of isolated islands from each other, and wherein the first material is different from a second material of the metal line and a third material of the metal via.

18. The integrated circuit structure of claim 17, wherein the first material comprises titanium, and the second material and the third material comprise copper.

19. The integrated circuit structure of claim 17, wherein a bottommost end of the portion of the conductive barrier layer is physically separated from a top surface of the metal line.

20. The integrated circuit structure of claim 17, wherein the plurality of isolated islands and the portion of the conductive barrier layer on the sidewalls of the dielectric layer are formed of a same material.

\* \* \* \* \*